US006664639B2

(12) United States Patent
Cleeves

(10) Patent No.: US 6,664,639 B2
(45) Date of Patent: Dec. 16, 2003

(54) CONTACT AND VIA STRUCTURE AND METHOD OF FABRICATION

(75) Inventor: James M. Cleeves, Redwood City, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 33 days.

(21) Appl. No.: 09/746,341

(22) Filed: Dec. 22, 2000

(65) Prior Publication Data

US 2002/0079553 A1 Jun. 27, 2002

(51) Int. Cl.$^7$ .............................................. H01L 23/48
(52) U.S. Cl. ....................... 257/774; 257/618; 257/623; 257/775
(58) Field of Search ................................ 257/698, 758, 257/773, 774, 775, 534, 618, 621, 623

(56) References Cited

U.S. PATENT DOCUMENTS

| 4,840,923 A | | 6/1989 | Flagello et al. |
| 4,922,320 A | * | 5/1990 | McDavid et al. ............. 357/67 |
| 5,227,013 A | | 7/1993 | Kumar |
| 5,550,404 A | * | 8/1996 | Yen et al. .................... 257/530 |
| 5,734,200 A | * | 3/1998 | Hsue et al. ................... 257/755 |
| 5,917,229 A | | 6/1999 | Nathan et al. |
| 6,031,257 A | * | 2/2000 | Noto et al. .................. 257/202 |
| 6,040,604 A | * | 3/2000 | Lauvray et al. ............. 257/355 |
| 6,093,963 A | * | 7/2000 | Chan et al. .................. 257/734 |
| 6,303,877 B2 | * | 10/2001 | Moriizumi et al. ......... 174/261 |

OTHER PUBLICATIONS

International Search Report PCT/US 01/29150.

\* cited by examiner

Primary Examiner—Kamand Cuneo
Assistant Examiner—Lourdes Cruz
(74) Attorney, Agent, or Firm—Blakely, Sokoloff, Taylor & Zafman LLP

(57) ABSTRACT

The present invention is a contact/via comprising and its method of fabrication. The contact/via of the present invention includes a conductive film. An opening having a top and bottom is formed on the conductive film. The opening has a first sidewall and a second sidewall wherein the first sidewall is opposite the second sidewall. The first sidewall has a stair step configuration such that the first sidewall is closer to the second sidewall at the bottom of the opening than at the top of the opening. A conductive film is then formed on the first sidewall in the opening and on the bottom of the opening on the conductive film.

21 Claims, 12 Drawing Sheets

`US 6,664,639 B2`

CONTACT AND VIA STRUCTURE AND METHOD OF FABRICATION

BACKGROUND OF THE INVENTION

1. Field of the Invention

The present invention relates to the field of semiconductor processing and more specifically to novel contact and via structures and their method of fabrication.

2. Discussion of Related Art

Modern integrated circuits and memory devices include multiple levels of metalization separated by insulating layers. The normal method of making contact from one metalization layer to another is to use photoresist as a mask and to dry etch the insulators stopping on the underlying conductor. Once an opening is formed this way, then the opening is filled with a second deposited conductor. Today the conductor is usually chemical vapor deposited (CVD) tungsten because the sidewall slopes are too steep for a sputtered metal to cover. Historically, people use trick etches of the insulator to provide a slope on the sidewalls so that the sputter metals could cover the sidewall and therefore not need CVD metal deposition. It is to be appreciated that presently low resistance metals such as aluminum is typically be deposited by sputtering and not by CVD. Today, however, people have gone away from slope sidewalls because the process is hard to control and because the area required to make the contact is too large.

SUMMARY OF THE INVENTION

The present invention is a contact/via and its method of fabrication. The contact/via of the present invention is formed on a first conductive film. The contact has a first sidewall and a second sidewall wherein the first sidewall is opposite the second sidewall. The first sidewall has a stair step configuration such that the first sidewall is closer to the second sidewall at the bottom of the contact than at the top of the contact. A second conductive film is formed on the stair step sidewall on the conductive film.

DETAILED DESCRIPTION OF THE PRESENT INVENTION

The present invention is a novel via/contact structure and its method of fabrication. In the following description numerous specific details are set forth such as specific material and layer thicknesses. It will be apparent, however, to one skilled in the art that the present invention may be practiced without these specific details. In other instances, well-known circuits and fabrication techniques have not been set forth in detail in order not to unnecessarily obscure the present invention.

Figure 1:
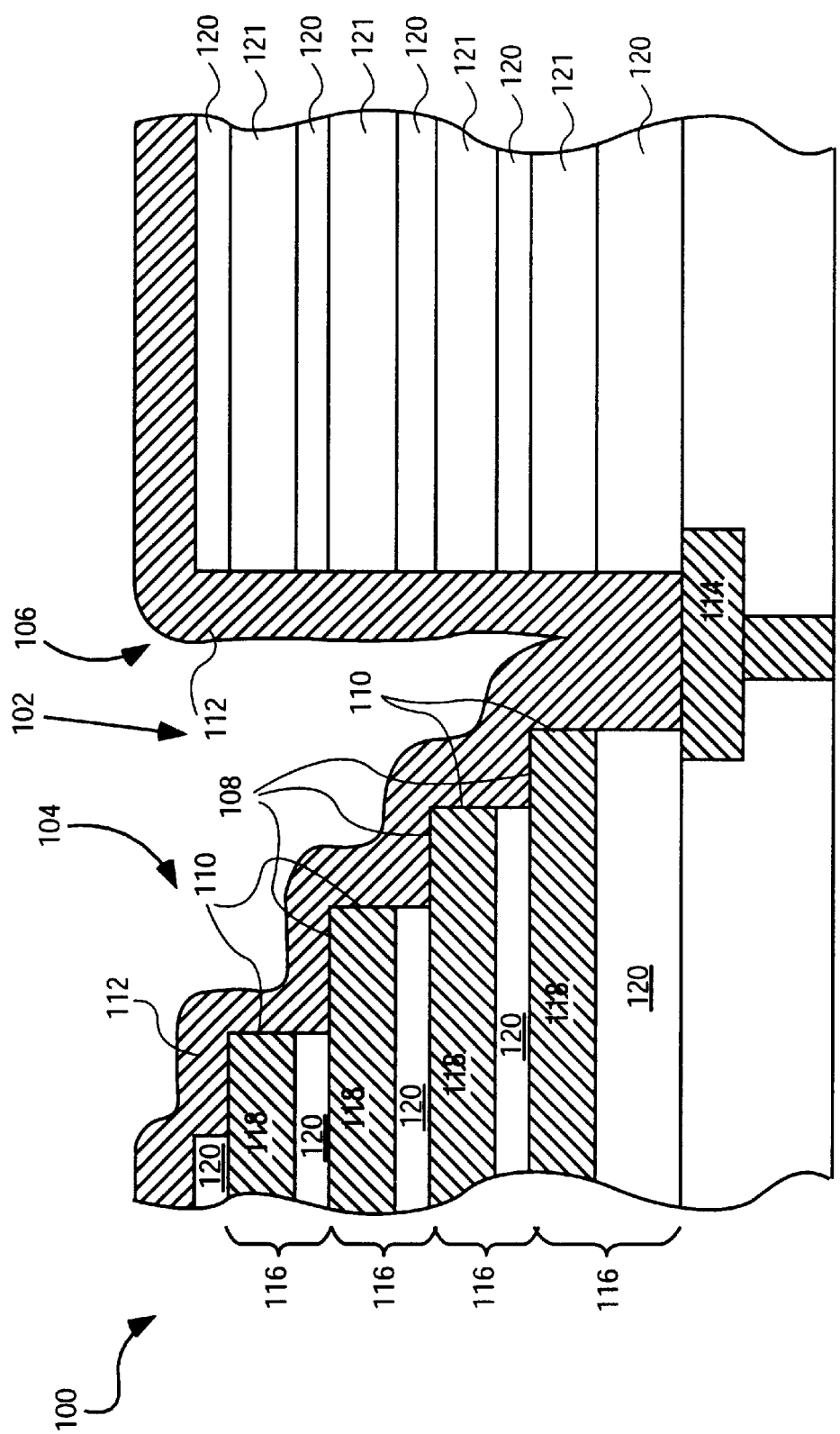
FIG. 1 is an illustration of a cross-sectional view of a contact or via having a stair stepped structure.

The present invention is a novel via/contact structure and its method of fabrication. An example of a contact structure 100 in accordance with the present invention is illustrated in FIG. 1. The contact of the present invention is contact or via 102 having laterally opposite sidewalls 104 and 106. One or both of the laterally opposite sidewalls of the contact is characterized by a stair step configuration which is generated by forming horizontal landing pads 108 on each film stack layer 116 by further offsetting the vertical edge 110 of each subsequently formed film stack 116 from the opposite sidewall 106 as shown in FIG. 1. Because sidewall 104 has a "stair step" configuration, a slope is built into the sidewall which enables a subsequently deposited upper metal or conductor 112 to be easily deposited down the stair step configuration without forming voids therein. The slope of the sidewall is defined by how much offset both vertically and horizontally there is between each film stack 116. In this way, a top conductive layer 112 can be made to make contact to an interconnection 114 located many levels below. Additionally, the sloped created by the stair step configuration enables conductor 112 to be deposited by sputtering which allows the conductor to be formed from low resistance materials, such as aluminum or aluminum alloys. It is to be appreciated that many low resistance materials such as aluminum or aluminum alloys are preferably be deposited by sputtering and not by chemical vapor deposition which can be used to fill high aspect ratio openings. The stair step sidewall 104 of the present invention allows a single continuous film to be deposited between the top most levels of metalization and the lower levels of metalization 114 enabling a low resistance contact to be made between the upper most levels of metalization (e.g., top metal) to the lower most levels of metalization of an integrated circuit. A low resistance contact is necessary for providing supply voltages, such as VCC or VSS, to power the substrate.

Additionally, the stair step configuration of the via sidewall of the present invention can also be used to electrically couple conductors in one level to conductors of another level or multiple other levels. For example as shown in FIG. 1, in an embodiment of the present invention, each film stack includes a top conductor 118 such as doped silicon film or a metal, such as aluminum or copper, and a lower dielectric layer 120 used to isolate the conductive film 118 from the conductive film in the stack below. The lateral offset of each subsequent film stack reveals the top conductive layer of each previously formed film stack enabling electrical contacts to be made to and between each conductive layer 118 of each film stack by contact film material 112 as shown in FIG. 1.

The contact of the present invention can be formed by first creating a stair step structure during the patterning of the individual film stacks 116. A via opening is then etched over the stair step structure utilizing an etchant which can etch the dielectrics (e.g., interlayer dielectrics 120 and fill dielectrics 121) adjacent to the stair step structure and which is selective to (i.e., will not etch) the top film 118 of the film stacks 116 so that the stair step configuration is maintained after the via or contact opening has been formed. The conductive film 112 can then be deposited on the stair step sidewall and make contact to a conductive film below.

As will be described below, the present invention is ideal for making electrical connections between multiple vertically separated layers of a three-dimensional memory array. Additionally, the present invention is ideal for use in bringing power (VCC) down from a top metal layer to the lower metal layers or the substrate in a low resistance method.

The novel via/contact structure of the present invention and its method of fabrication will now be described with respect to the fabrication of a specific three-dimensional nonvolatile memory array. First the structure and method of fabricating a three-dimensional nonvolatile memory array will be described in FIGS. 2–11, and then methods of forming the via/contact structures of the present invention in a three-dimensional nonvolatile memory array will be described in FIGS. 12a–12g. It is to appreciated that the specific implementation is for illustrative purposes only and the present invention is not to be limited to this specific embodiment and that the structure and method of the present invention can be used in other types of memory devices or integrated circuits including logic circuits. The present invention is especially useful in integrated circuits which require contacts to multiple layers or where low resistance electrical connections are necessary from the upper most levels of metalization to the lower most. The stair step configuration allows good electrical contact between more than two layers. The stair step configuration allows controlled sidewall shape without the use of trick chemistry etches.

Overview of the Structure of the Memory Array

The memory array is fabricated on several levels and, for instance, may have eight levels of storage. Each level includes a first plurality of parallel spaced-apart rail stacks running in a first direction and a second plurality of rail stacks running in a second direction. Generally, the first rail stacks run perpendicular to the second conductors/rail stacks and hence form a right angle at their intersections.

The use of rail stacks is a departure from prior art three-dimensional memories where conductors alone were used in lieu of rail stacks, and where discrete cells (e.g., pillars) were formed at the intersections of the lines. As will be seen, a bit is stored at each of the intersections of rail stacks. However, there is no apparent individual memory cell at the intersections, rather memory cells are defined by the rail stacks and intermediate layers. This makes it easier to fabricate the invented array as will be seen. When the array is fabricated all the bits are in the zero (or one) state and after programming, the programmed bits are in the one (or zero) state.

Figure 2:
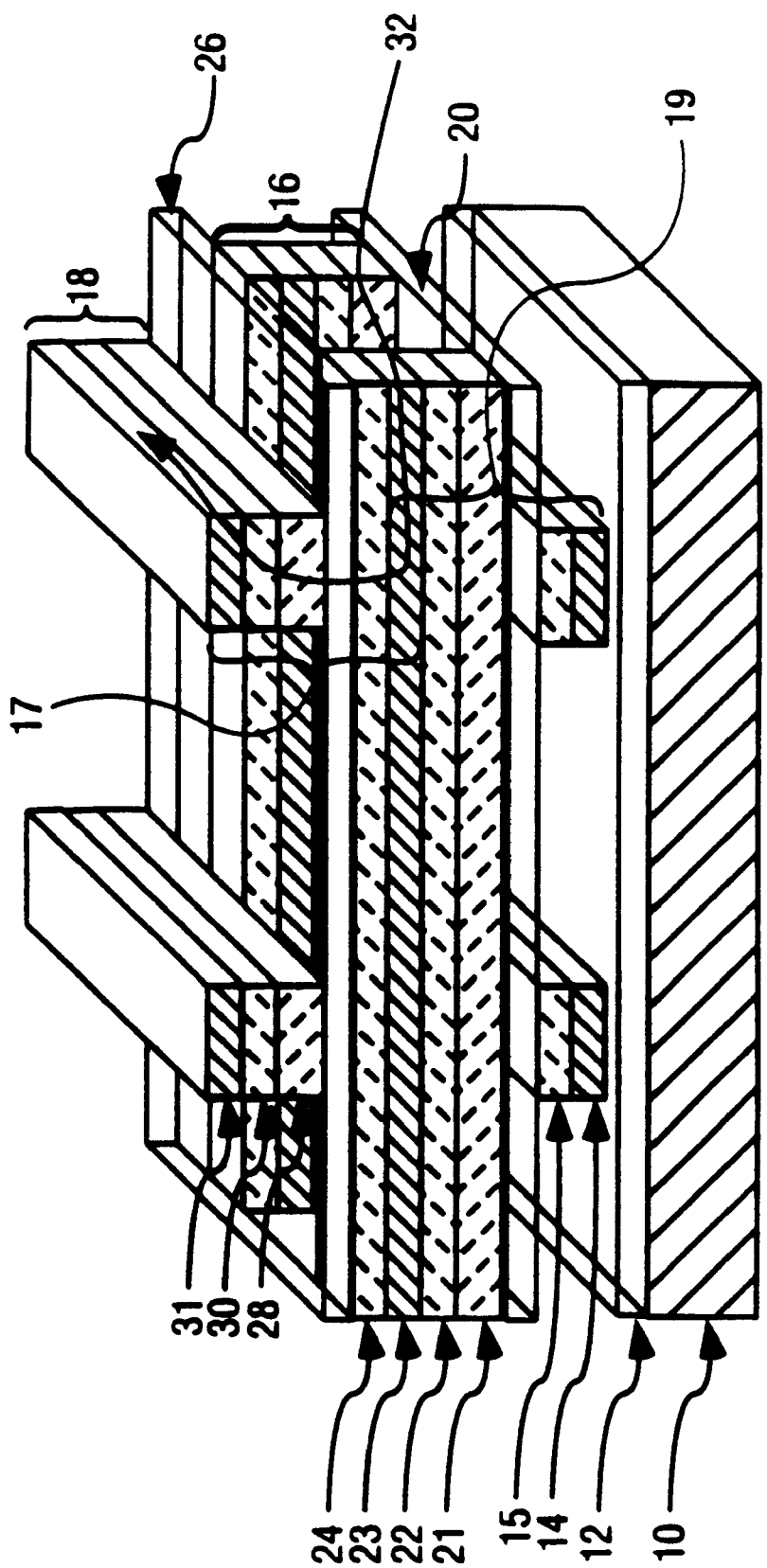
FIG. 2 is a perspective view of a cut-away portion of a memory array.

In the embodiment FIG. 2 several rail stacks are illustrated in the partial cross-section of the invented array. For instance, rail-stack 16 is shown at one height and a half rail-stack 18 is shown at a second height above the first height. Also, half rail stacks are disposed between rail-stack 16 and a substrate 10. These lower rail stacks run in the same direction as the half rail-stack 18. A bit is stored at the intersection of rail stacks and, for instance, a "cell" is present between the rail stacks and layers shown within the bracket 17 and another within the bracket 19. Each of these brackets span a memory level.

The array is fabricated on a substrate 10 which may be an ordinary monocrystaline silicon substrate. Decoding circuitry, sensing circuits, and programming circuits are fabricated in one embodiment within the substrate 10 under the memory array using, for instance, ordinary MOS fabrication techniques. Vias are used to connect conductors within the rail stacks to the substrates to allow access to each rail-stack in order to program data into the array and to read data from the array. For instance, the circuitry within the substrate 10 may select rail-stack 16 and the rail stack 18 in order to either program or read a bit associated with the intersection of these rail stacks. (In the case of the embodiments of FIG. 5 some conductors are not part of rail stacks; these conductors are also coupled to the substrate circuits.)

As shown in FIG. 2, an insulating layer 12 is formed over the substrate in order that the array may be fabricated above the substrate. This layer may be planarized with, for instance, chemical-mechanical polishing (CMP) to provide a flat surface upon which the array may be fabricated.

Following this, a conductive layer 14 is formed on the substrate. As will be seen, conductive layers are used within the rail stacks and these layers and the resultant conductors may be fabricated from elemental metals such as tungsten, tantalum, aluminum, copper or metal alloys may be used such as MoW. Metal silicides may also be used such as $TiSi_2$, $CoSi_2$ or a conductive compound such as TiN, WC may be used. A highly doped semiconductor layer such as silicon is also suitable. Multiple layer structures may be used selecting one or more of the above.

Following the deposition of a conductive layer, a layer of semiconductor material (layer 15) such as silicon is formed over the conductive layer. This is typically a polysilicon layer, however, an amorphous layer may be used. Other semiconductor materials may be used such as Ge, GaAs, etc. In the embodiment of FIG. 2 this semiconductor layer is highly doped and, as will be seen, forms one-half a diode. After masking and etching steps, half rail stacks are formed. These rail stacks are "half" or partial rail stacks since they are approximately half the thickness of the rail stacks used in the next level.

Following a dielectric deposition and polish to form a dielectric fill, in the embodiment of FIG. 2, a material for the antifuses used to program the array is deposited. In one embodiment, the layer 20 is a dielectric such as silicon dioxide which is deposited by chemical vapor deposition (CVD) in a blanket deposition over the half rail stacks and over the dielectric fill, filling the space between the rail stacks. In another embodiment the layer 20 is grown on the upper surface of the silicon layer 15 and only exists on the rail stacks.

Now a full set of memory array rail stacks is formed on the layer 20. This comprises first the deposition of a lightly doped silicon layer 21 doped with a conductivity type dopant opposite to that used for the silicon layer 15, a heavily doped silicon layer 22 doped also opposite to the layer 15, a conductive layer 23 and a heavily doped silicon layer 24 doped with the same conductivity type dopant as layers 21 and 22. After masking and etching, the rail stacks shown in FIG. 2, such as rail-stack 16 are formed. These rail stacks are, as illustrated, in a direction perpendicular to the rail stacks above and below them.

While not shown in FIG. 2 but as will be described later, the spaces between the rail stacks after they are defined, are filled with a dielectric such as silicon dioxide. Then the rail stacks and fill are planarized by CMP. In another embodiment spin-on-glass (SOG) is used to fill the voids, in this case chemical planarization can be used, for example, plasma etching. Other fill and planarization methods can be used.

After formation of the rail stacks another antifuse layer 26 is formed, for instance, from a dielectric such as silicon dioxide, silicon nitride, silicon oxynitride, amorphous carbon or other insulating materials or combinations of materials. (Also an undoped layer of silicon may be used for the antifuse layer.)

Now another layer of rail stacks are defined and only half rail stacks are shown in FIG. 2 at this upper level. This half rail-stack comprises a silicon layer 28 doped with a conductivity type dopant opposite to that of layer 24. This is a lightly doped layer. Another silicon layer 30 is formed on layer 28 and this layer is doped with the same conductivity type dopant as layer 28, however, it is more heavily doped. Then a conductive layer 31 is formed above the layer 30.

Half rail stacks are used at the very upper-most level of the array and at the very lowest level of the array. In between the half rail stacks the full rail stacks, such as rail-stack 16, are used throughout the array. As will be seen below, a full rail stack can be used for the upper most level of the array to ensure complete filling of the top vias with conductive film.

It should be noted that the silicon layers disposed on the conductive layers extend the entire length of the rail stacks in the embodiment of FIG. 2 and are uninterrupted except possibly where vias are used to provide a conductive path to the substrate 10.

In FIG. 2 a path 32 is illustrated from a lower conductor in level 17 to an upper conductor in this level found in the rail-stack 18. This path is accessed in one embodiment through decoding circuitry in the substrate for both programming and reading of data into and from the array for one bit.

For instance, to program the bit, a relatively high voltage, 5–20V is applied between the conductors generally so as to forward-bias the "diode" between these conductors. This relatively high voltage causes a breach in the layer 26 creating a diode. Without this high voltage, the layer 26 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 26 is intact between the rail stacks. Note that "sneak" or parasitic paths in the array which would interfere with the sensing will include a reverse-biased diode.

Also as will be described later, the "anode" and "cathode" of the diodes are reversed at each of the successive antifuse layers. This facilitates easier programming and sensing since all of its conductors at each level are either bit lines or word lines. And, for instance, conductors at one height will serve as bit lines for two levels and conductors at the next height serve as word lines for two levels. This simplifies the decoding and sensing and more importantly reduces processing.

Figure 3:
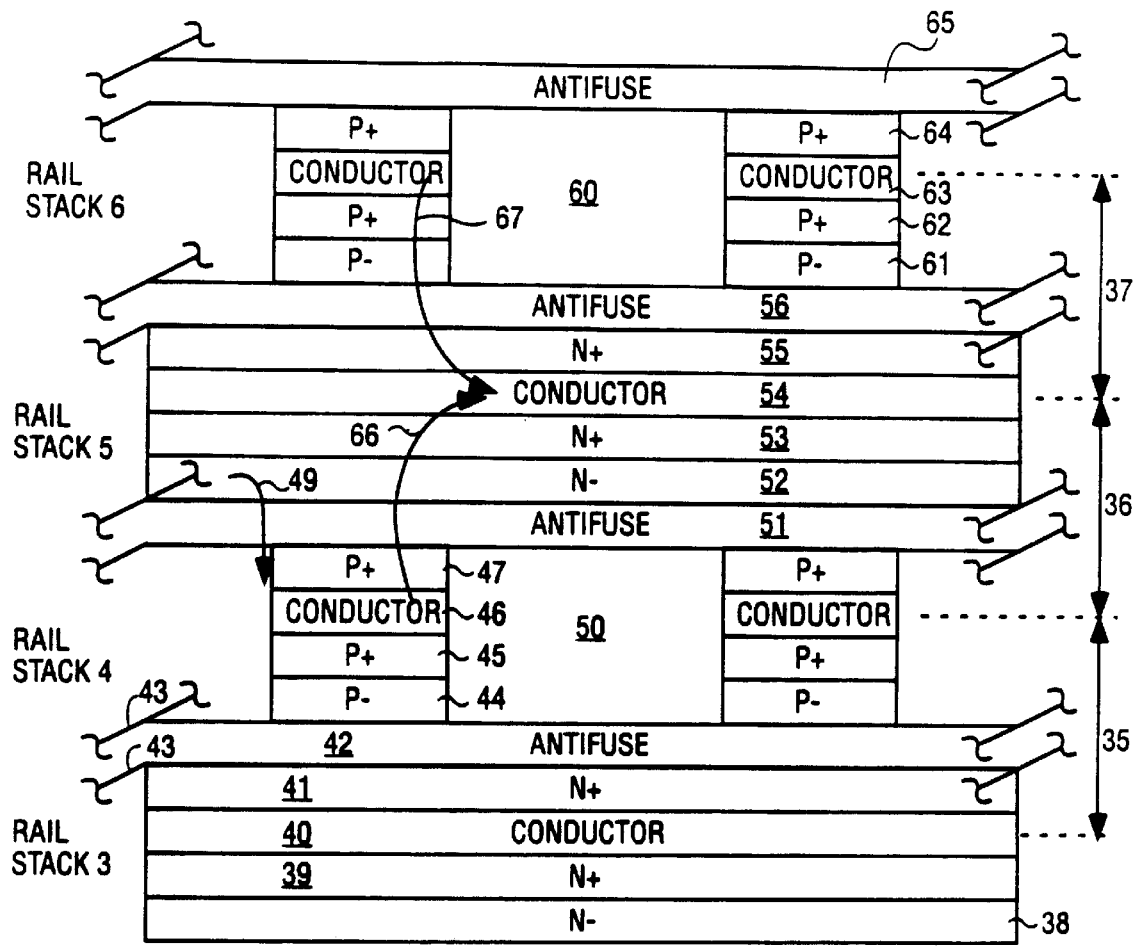
FIG. 3 is a cross-sectional elevation view of one embodiment of the present invented array.

Embodiment of FIG. 3

In the cross-section elevation view of FIG. 3, one embodiment is illustrated which corresponds to the embodiment shown in FIG. 1. In FIG. 3 the half rail stacks of FIG. 2 are not illustrated. Three complete levels 35, 36 and 37 of the array are illustrated in FIG. 3. Below layer 38 of FIG. 3 other rail stacks or half rail-stack are used. Also above layer 65, a full or half rail-stack is used.

The rail-stack 3 comprising layers 38 through 41 includes a lightly doped N− layer 38, a heavily doped N+ layer 39, a conductor layer 40 and N+ layer 41. The fabrication of these rail stacks will be discussed in more detail in conjunction with FIG. 3 through FIG. 13. An antifuse layer 42 which for the embodiment of FIG. 3 is a blanket deposition covers all of the rail stacks formed below layer 42 as well as the fill filling the voids between the rails. As mentioned, the layer 42 can be a deposited silicon dioxide layer in one embodiment.

It should be noted that N+ layers sandwich the conductor layer 40. These highly doped layers provide ohmic transitions to prevent unintended Schottky diode.

The layers above and below conductor 40 are not symmetrical for the embodiment illustrated in that an N− layer 38 is used below the conductor 40 and not above the conductor 40. Only a single lightly doped layer (in conjunction with a heavily doped layer) is needed to define a diode; the thickness of this lightly doped layer is important in controlling the break-down voltage, reverse leakage current and resistance of the diode so formed. The layer 41, a heavily doped semiconductor layer, and the fill are planarized after the rail stacks are defined and then a blanket deposition of the antifuse layer 42 is formed on the layer 41. It is important to ensure that the planarization step exposes layer 41 everywhere so that the devices work properly. (The lines 43 in FIG. 3 are used to indicate that the antifuse layer 42 and like layers are not etched with the rail-stack below it and thus extend over the entire array for the illustrated embodiment.)

One advantage to the layer 42 and the other like layers in the structure, such as layers 51, 56 and 65, is that since they are an unbroken deposition, sidewall leakage (into the rail stacks below) will be minimized, limiting electrical problems during reading and writing. When subsequent conductive material is deposited, it is unable to reach the sides of the rail stacks below it because of this blanket deposition of the antifuse layer. For instance, path 49 which would allow silicon from layer 52 to cause a parasitic path does not exist because of the unbroken blanket deposition of the antifuse layer 51.

Rail stacks 4 comprising layers 44, 45, 46 and 47 are formed on the antifuse layer 42. Layer 44 is lightly doped with a P-type dopant for the embodiment illustrated followed by a P+ layer 45, a conductive layer 46 and a P+ layer 47. After these layers are deposited, they are masked and etched to define the rail stacks. Then the voids between these rail stacks, such as void 50, are filled with a dielectric. The fill dielectric is planarized along with a portion of P+ layer 47. Planarization is done at this point in the fabrication since there is generally poor control over the thickness and contour of the fill. The fill tends to build up on the rail stacks when a noN-spiN-on deposition is used. This is followed by a blanket deposition of layer 51.

The process is now repeated this time beginning with an N− layer 52 followed by an N+ layer 53, a conductive layer 54 and N+ layer 55. Again after defining the rail stacks 5, the voids are filled and the surface is planarized. Another antifuse layer 56 is deposited.

The process is repeated for the rail stacks 6 this time beginning with a P− layer 61, P+ layer 62, conductive layer 63, P+ layer 64. Again after defining the rail stacks, filling the void 60 and then planarizing, another antifuse layer 65 is deposited.

As shown by the path 66, when a large enough voltage is applied between conductors 46 and 54 the antifuse layer 51, at the intersection of layers 47 and 52 is breached or ruptured creating a diode at the intersection. As mentioned, this is selectively done throughout the array to program the array. The conductor 54 is therefore a bit line for the "cells" above and below it, for instance path 67 indicates another possible current path for another "cell" where the conductor 54 is again a bit line during sensing.

It should be noted that with the reversal of the P− and N− layers at each successive rail-stack, planarization always occurs on a heavily doped layer such as layer 47 and layer 55. Moreover, the lightly doped layers are always formed on relatively planar surfaces, consequently their thickness can be more easily controlled. This, as mentioned, allows the characteristics of the diode (once the intermediate antifuse layer is breached) to be more reliably controlled.

Processing Flow for the Embodiment of FIG. 3

The process flow for forming rail-stack 5 of FIG. 3 is illustrated in FIGS. 4–11. It will be apparent that the rail stacks for the other embodiment can be similarly processed.

Figure 4:
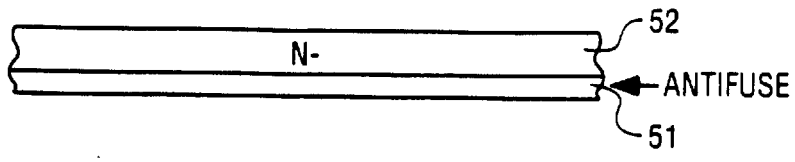
FIG. 4 is a cross-sectional elevation view of an antifuse and semiconductor layer formed during the fabrication of the invented array.

First, as shown in FIG. 4 an antifuse layer 51 is deposited. This typically is 25–200 Å of silicon dioxide which can be deposited with any one of very well-known processes. Following this, a silicon layer 52 is deposited which is typically 1000–4000 Å thick and formed with a CVD process where a phosphorous dopant is deposited along with the deposition of for instance, the polysilicon semiconductor material or where the dopant is ion implanted following the deposition of the layer. This layer is doped to a level of between $5 \times 10^{15} - 1 \times 10^{18}/cm^3$.

In this application "polysilicon" layers may be deposited as polysilicon or may be formed from an amorphous silicon layer. In one embodiment, an amorphous silicon layer is deposited and annealed in a rapid thermal anneal (RTA) step of 800° C. for 1 minute. This increases the crystal sizes and activates the dopant. The dopant can be ion implanted or introduced during the deposition of the amorphous silicon layer.

Figure 5:
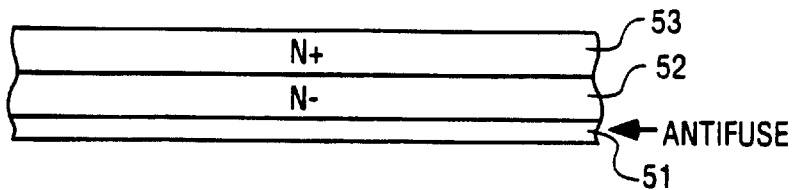
FIG. 5 illustrates the structure of FIG. 4 after an additional semiconductor layer has been formed.

Now, as shown in FIG. 5 a N+ layer 53 is deposited again using CVD. This layer may be approximately 300–3000 Å thick and in one embodiment is doped to a level of $>10^{19}/cm^3$.

Throughout this application two adjacent silicon layers are often shown such as layers 52 and 53, with different doping. These layers may be formed in one deposition by in-situ doping and altering the dopant concentration during deposition. Alternatively, they can be formed with one deposition followed by an ion implantation step at two different energy levels and dosages to obtain the two doping levels.

Figure 6:
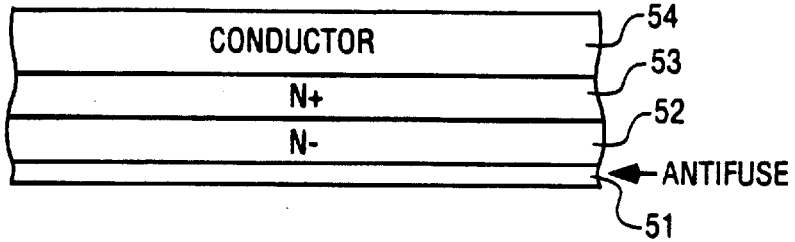
FIG. 6 illustrates the structure of FIG. 5 after a conductive layer is formed.

Next, as shown in FIG. 6, a conductive layer which may be 500–1500 Å thick is formed using any one of numerous well-known thin film deposition process such as sputtering. A refractory metal may be used or a silicide of a refractory metal. Also as mentioned aluminum or copper can be used, or more simply the heavily doped silicon can be the conductor.

Figure 7:
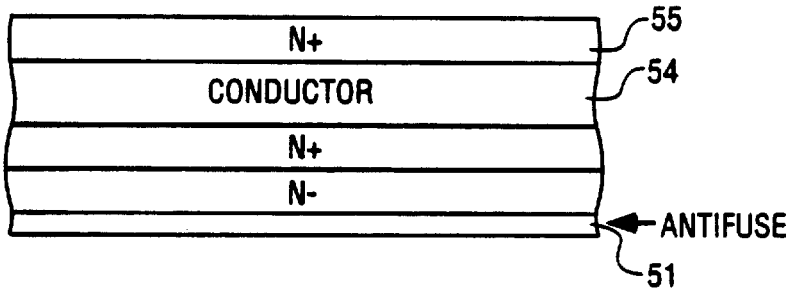
FIG. 7 illustrates the structure of FIG. 6 after an additional semiconductor layer has been formed.

Next, as shown in FIG. 7, another semiconductor layer of, for instance, n type polysilicon approximately 1500–2000 Å thick is formed again doped to a level of $>10^{19}/cm^3$. This is shown as layer 55 in FIG. 6; after planarization its thickness is between 300 Å and 2000 Å thick.

Figure 8:
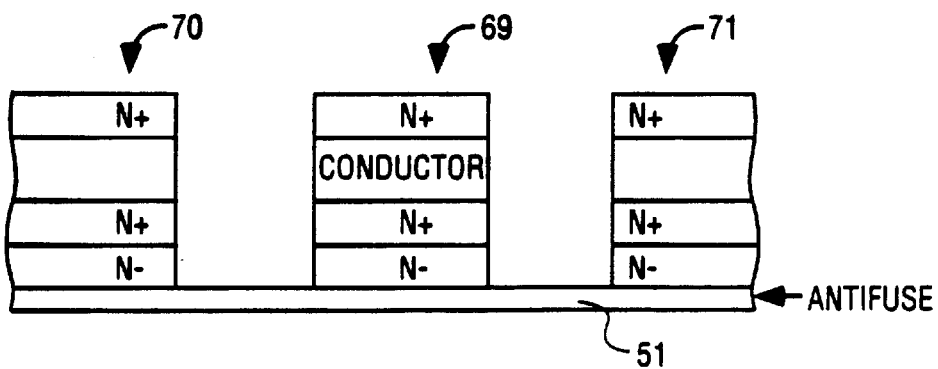
FIG. 8 illustrates the structure of FIG. 7 after a masking and etching step.

A masking and etching step is now used to define rail stacks, such as rail stacks 69, 70 and 71 shown in FIG. 8. Note that when comparing this view to the view of rail-stack 5 of FIG. 3, the view in FIG. 8 is taken from the side and consequently shows the individual rail stacks. An ordinary masking and etching step for instance photolithography followed by plasma etching, may be used. Etchants can be used that stop on the antifuse layer thus preventing this layer from being etched away. Thus, layer 51 can be considered an etchant stop layer depending on the specific etchants used.

Figure 9:
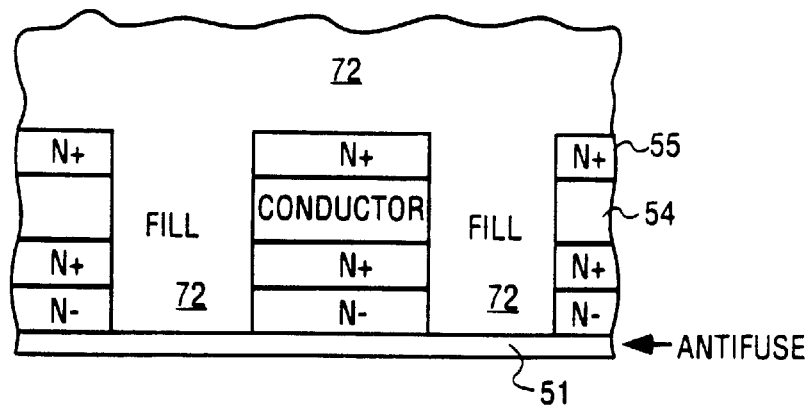
FIG. 9 illustrates the structure of FIG. 8 after open spaces left from the etching step have been filled.

Now as shown in FIG. 9, the spaces between the rail stacks are filled with a dielectric 72 such as formed with a high density plasma chemical vapor deposition (HDPCVD) process.

Figure 10:
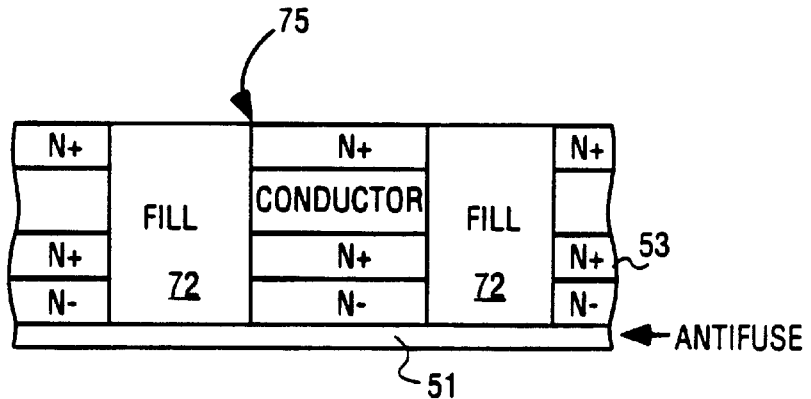
FIG. 10 illustrates the structure of FIG. 9 after a planarization step.

Chemical-mechanical polishing is then employed to planarize the upper surface of the rail stacks shown in FIG. 10 in one embodiment. Chemical etching can also be used as mentioned with certain dielectrics. This planarization can reduce the thickness of the layer 55 to approximately 300 Å, thus this layer ends up being of approximately the same thickness as the layer 53. After planarization, the substrate has a planarized surface 75 whereby the top surface of the N+ regions of the rail stacks 69, 70 and 71 are substantially planar with the top surfaces of dielectric fill 72.

Figure 11:
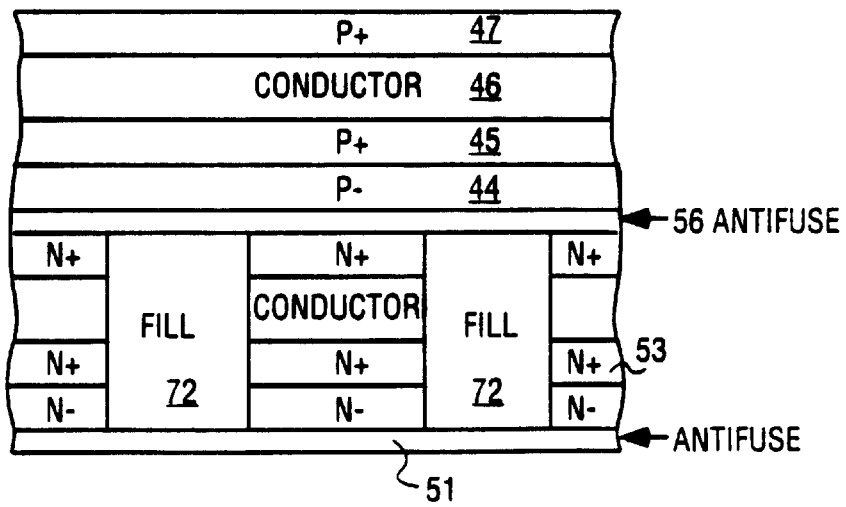
FIG. 11 illustrates the structure of FIG. 10 after the formation of a second plurality of rail stacks.

Next, as shown in FIG. 11, an antifuse layer is formed over the top N+ silicon film 55 and fill dielectric 72. The p type silicon films of fifth rail stack are then sequentially deposited on the antifuse layer 56. The p type silicon films are then patterned into a plurality of rail stacks running perpendicular to rail stacks 70, 69, and 71.

It should be noted that in FIG. 3 while the antifuse layer is shown as a blanket layer covering the rail stacks and fill, it is possible also to fabricate each level where the antifuse layer is in fact grown from a semiconductor layer. For instance, an oxidation step may be used to grow a silicon dioxide layer from layers 41, 47, 55 and 64. This grown layer would then be in lieu of the antifuse layers shown in FIG. 3.

Figure 12A:
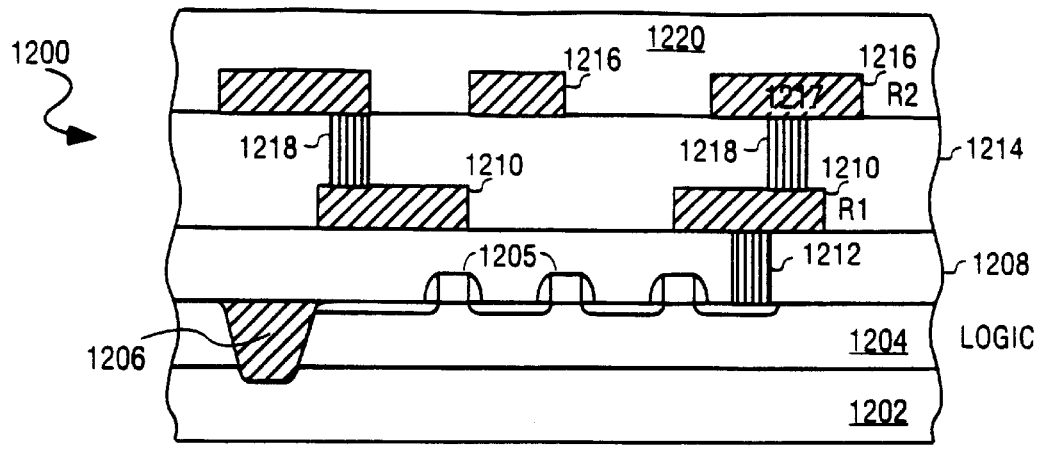
FIG. 12a illustrates a substrate on which a memory array can be formed.

FIG. 12a is an illustration of a cross-sectional view of a substrate 1200 on which a nonvolatile memory array can be formed. Substrate 1200 includes a monocrystalline silicon substrate 1202 on which is formed a plurality of doped wells 1204 on/in which a plurality of transistors 1205, such as MOS transistors, are formed. Isolation regions 1206 such as trench or LOCOS isolation provide isolation between adjacent wells and transistors. Substrate 1200 includes a first interlayer dielectric 1208 which isolates a first level of metalization or routing 1210 such as aluminum or aluminum alloy from the transistors located below. Contacts 1212 such as tungsten plugs are used to electrically couple the first level of metalization (or routing) to the transistors below. Substrate 1200 also includes a second interlayer dielectric (ILD) 1214 used to isolate a second level of metalization (or routing) 1216 from the first level of metalization 1210. Via connections 1218 such as tungsten plugs are used to electrically couple the first level of metalization and the second level of metalization. First and second levels of metalization electrically couple the transistors 1204 into functional logic circuits which can be used to access, program, and read the memory devices formed above. Substrate 1200 includes a planar interlayer dielectric 1220 on which the memory devices of the present invention are fabricated. A method of forming an electrical contact to interconnect 1217 of the second level of metalization 1216 during the fabrication of the memory cells will now be described.

Figure 12B:
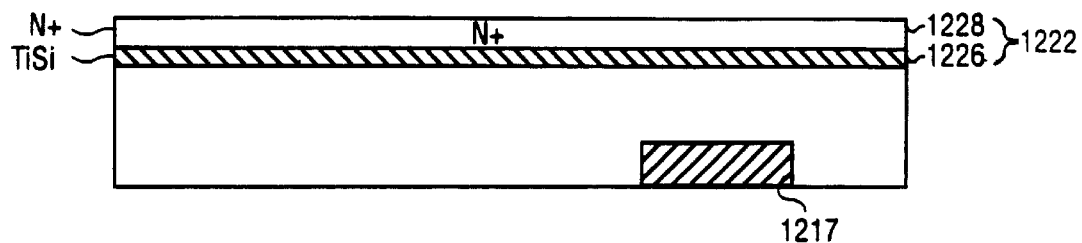
FIG. 12b illustrates the substrate of FIG. 12A after the formation of a titanium silicide and an N+ silicon film.

In order to form a three-dimensional memory of the present invention, first the films of the first rail stack are formed (e.g., bit line 1). The first rail stack 1222, which will typically be only a half rail because there are no cells located below, can be formed by blanket depositing a conductive layer 1226 over and onto the planarized ILD layer 1220 and then an N+ silicon film 1228 over the conductive layer 1226 as shown in FIG. 12b. In an embodiment of the present invention, the conductive layer is a titanium silicide film capped with a titanium nitride film.

Figure 12C:
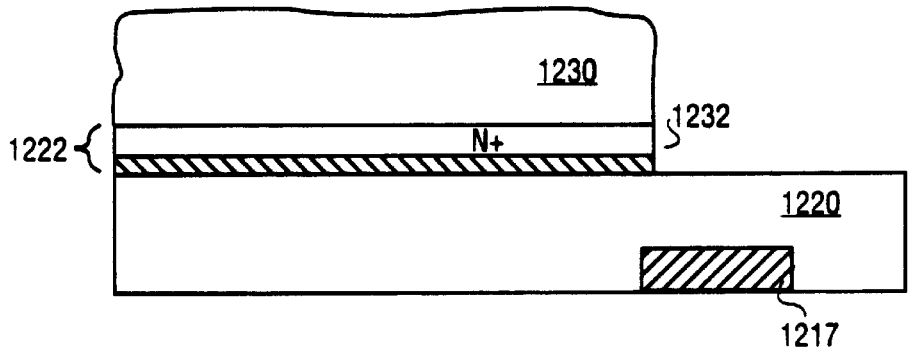
FIG. 12c illustrates the structure of FIG. 12B after the patterning of the titanium silicide and N+ silicon layer.

Next, as shown in FIG. 12c, a photoresist layer 1230 is formed onto silicon film 1228 which is used to pattern the films of the first rail stack into a first plurality of rail stacks and to form a first rail stack 1222 as shown in FIG. 12c. The first rail stack 1222 has a vertical edge 1232 which lies over the interconnection 1217 of the second level of metalization 1216 to which a contact is desired. A silicon film and a titanium silicide film can be patterned in alignment with photoresist layer 1230 utilizing plasma etch with a chemistry comprising $Cl_2$ and HBr.

Figure 12D:
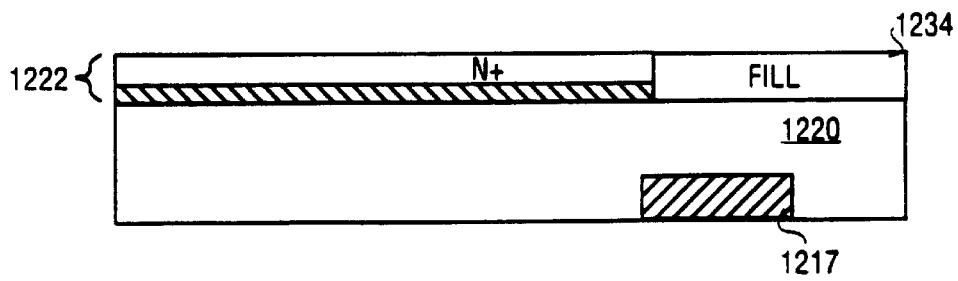
FIG. 12d illustrates the structure of FIG. 12C after depositing and planarizing the fill dielectric.

Next, the photoresist mask 1230 is removed and a dielectric such as a silicon oxide film formed by high-density plasma, is formed on and between the first plurality of rail stacks. The dielectric is then planarized back to the top surface of the N+ layer 1228, as shown in FIG. 12d, to form a fill dielectric 1234.

Figure 12E:
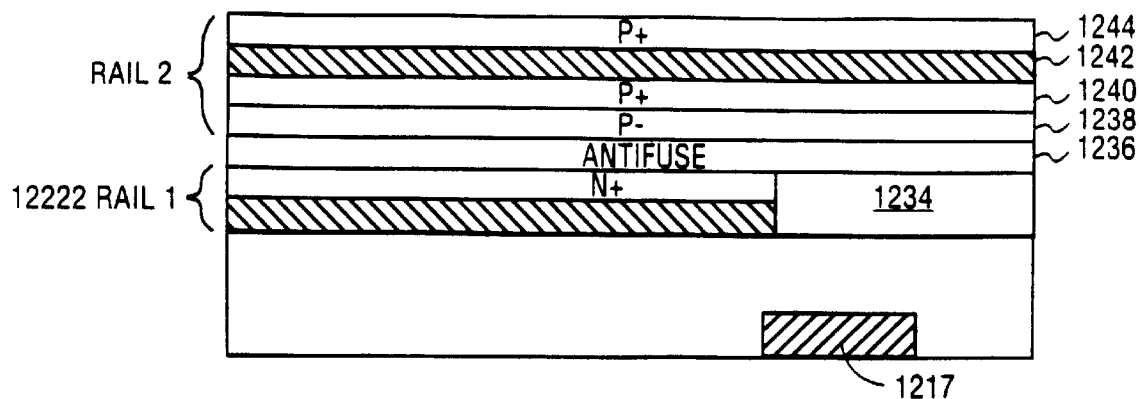
FIG. 12e illustrates the structure of FIG. 12D after the formation of the second rail stack.

Next, as shown in FIG. 12e, an antifuse layer 1236 is formed over onto the first plurality of rail stacks. In an embodiment of the present invention, the antifuse 1236 is a deposited film which forms over and onto the rail stack 1222 as well as onto the fill dielectric 1234. In an embodiment of the present invention, the antifuse 1236 is a silicon dioxide film deposited by a plasma enhanced CVD process. In an embodiment of the present invention, the antifuse layer is a grown oxide, and as such the antifuse grows only on silicon surfaces such as N+ silicon film 1228 and not on fill dielectric 1234.

Next, as also shown in FIG. 12e, the films of the second rail stack (e.g., wordline 1) are sequentially blanket deposited onto antifuse layer 1234 as shown in FIG. 12e. In an embodiment of the present invention, the second rail stack comprises a lower P– silicon film 1238 formed on the antifuse layer 1236, a P+ silicon film 1240 formed on the P– silicon film 1238, a conductor layer 1242 formed on the P+ silicon film 1240 and a top P+ silicon film 1244 formed on the conductor layer 1242. In an embodiment of the present invention, the conductor layer is a titanium nitride/titanium silicon film stack formed by depositing, such as by sputtering, a titanium film onto the P+ silicon film 1242 and then depositing a titanium nitride capping layer on the titanium layer. A subsequent rapid thermal anneal is used to react the titanium film with the underlying P+ silicon film 1240 to form a titanium silicide film capped with a titanium nitride film.

Figure 12F:
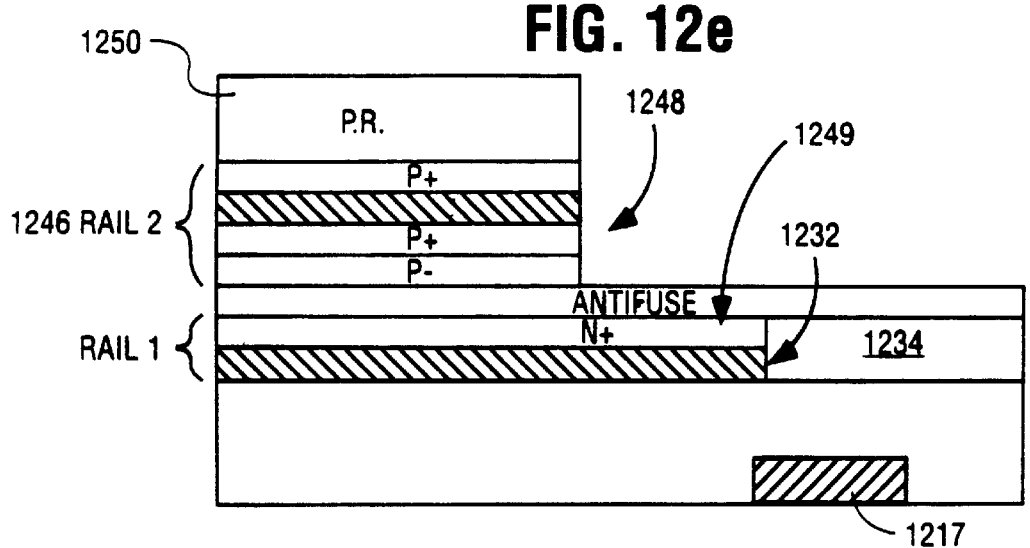
FIG. 12f illustrates the structure of FIG. 12E after patterning the second rail stack.

Next, as shown in FIG. 12f, the films of the second rail stacks are now patterned into a second plurality of rail stacks and to form a rail stack 1246 having a vertical edge 1248 located above and over the first rail stack. The vertical edge 1248 of second rail stack 1246 is laterally offset from the edge 1232 of the first rail stack 1222. The amount of offset between the vertical edges will define the size of the landing area 1249 for the contact fill on rail stack 1222. In an embodiment of the present invention, the edge 1248 is offset between 0.25–1.0 $\mu$m from the edge 1232. Rail stack 1246 can be patterned by forming a mask 1250 with well-known photolithography techniques and utilizing an etchant which can etch silicon films but which is selective to the antifuse material. In this way, the antifuse material acts as an etch stop for the rail stack patterning and protects the underlying N+ silicon film 1228 from being etched and thereby preserving the landing area 1249. A silicon film and a titanium silicide film can be patterned in alignment with photoresist layer 1250 without significantly etching an oxide antifuse by utilizing a plasma etch with a chemistry comprising $Cl_2$ and HBr.

Figure 12G:
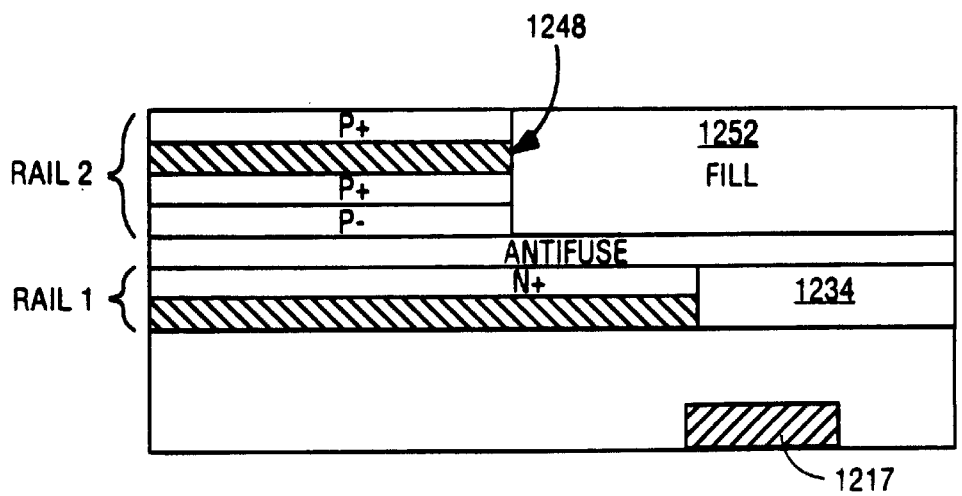
FIG. 12g illustrates the structure of FIG. 12F after depositing and planarizing a fill dielectric.

Next, fill dielectric, such as silicon oxide, is formed by a high-density plasma and is formed on and between the second plurality of rail stacks and then is planarized back such as by chemical mechanical polishing to the top surface of the P+ layer 1244 as shown in FIG. 12g to form fill dielectric 1252 adjacent to the edge 1248 of rail stack 1246.

Figure 12H:
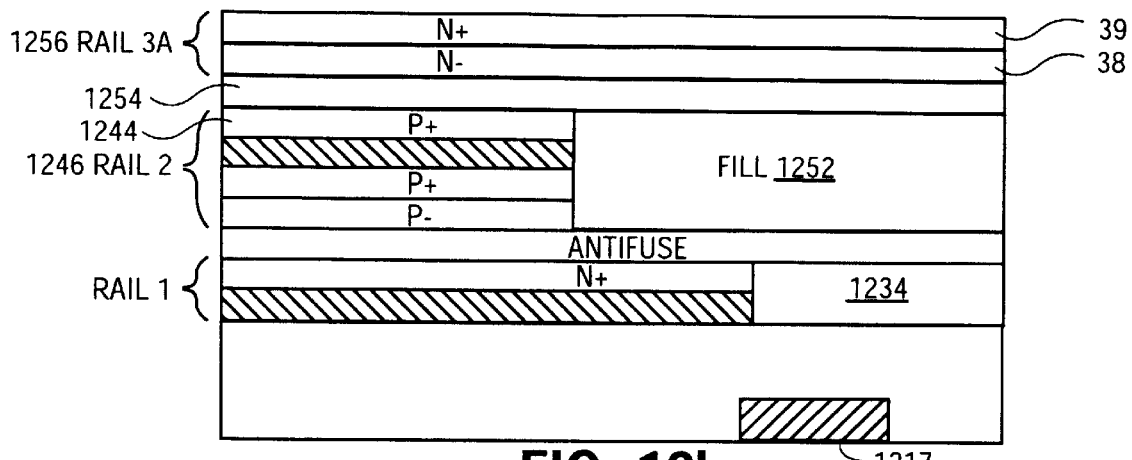
FIG. 12h illustrates the structure of FIG. 12G after the formation of a first portion of the films for the third rail stack.

Next, as shown in FIG. 12h, an antifuse layer 1254 is formed over and onto the second plurality of rail stacks 1246. In an embodiment of the present invention, the antifuse 1254 is a deposited over and onto the second plurality of rail stacks 1246 and fill dielectric 1252 as shown in FIG. 12h. In an embodiment of the present invention, the antifuse 1254 is a silicon dioxide film deposited by a plasma enhanced CVD process. In an alternative embodiment of the present invention, the antifuse layer 1254 is a grown oxide and as such the antifuse 1254 will grow only on silicon surfaces such as P+ silicon film 1244 and not on fill dielectric 1252.

Next, as also shown in FIG. 12h, a first portion 1256 of the films for the third rail stack are sequentially blanket deposited over and onto the antifuse layer 1254. In an embodiment of the present invention, the first portion 1256 of the third rail stack comprises a lower N− silicon film 38 and an N+ silicon film 39.

Figure 12I:
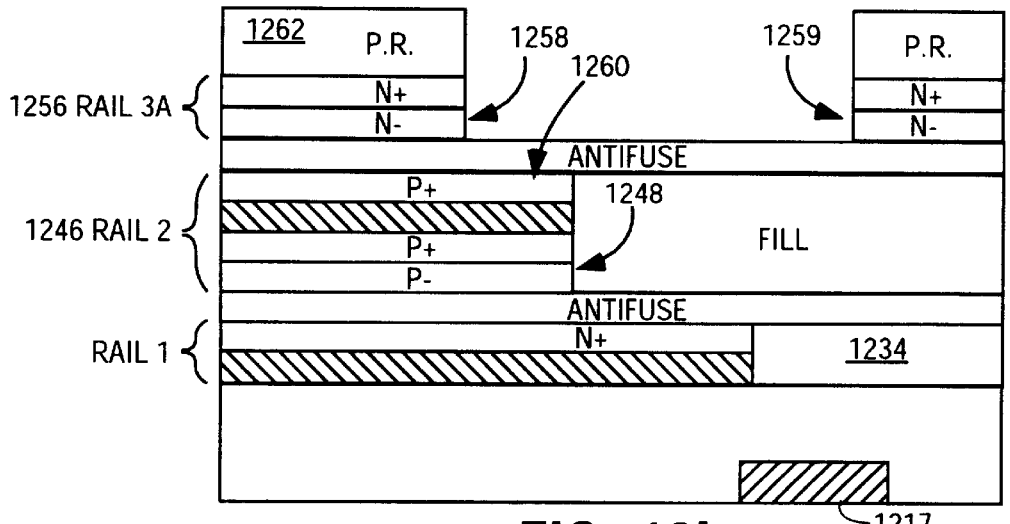
FIG. 12i illustrates the structure of FIG. 12H after the patterning of the first portion of the films for the third rail stack.

Next, as shown in FIG. 12i, a photoresist mask 1262 defining the top of the via opening is formed on the first portion 1256 of the third rail stack. The first portion 1256 of the third rail stack is then etched in alignment with the photoresist mask 1262 to define a vertical edge 1258 located above and over the second rail stack and to define a second vertical edge 1259, opposite the first, above and over interconnection 1217 to which the contact is to connect. The vertical edge 1258 of the first portion of the third rail stack is laterally offset from edge 1248 of the second rail stack 1246. The amount of offset between the vertical edges 1258 and 1248 will define the size of the landing area 1260 for the first contact fill on the second rail stack 1246. In an embodiment of the present invention, the edge 1258 is offset between 0.25–1.0 μm from the edge 1248. The first portion 1256 of the third rail stack is etched utilizing an etchant which can etch the films of the rail stack but which is selective to the antifuse material. In this way, the antifuse material acts as an etch stop and protects the underlying rail films from being etched and thereby preserves the landing area 1260. If the rail films are silicon and the antifuse material is an oxide then the rail films can be etched selectively with respect to the antifuse material by utilizing a plasma etch comprising HBr and $Cl_2$.

Figure 12J:
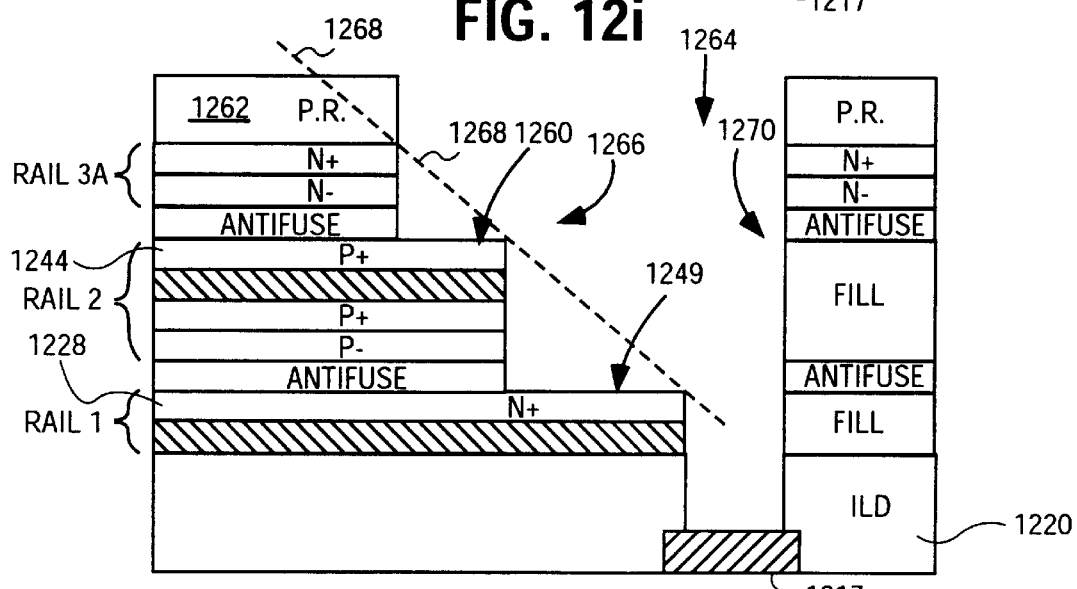
FIG. 12j illustrates the structure of FIG. 12I after the etching of a via hole.

Next, as shown in FIG. 12j, the etch chemistry is now switched to a etch chemistry which can etch the fill dielectrics (1234, 1248) and ILD 1214 (and antifuse layer if over the fill dielectric) and which is selective to the top films 1228 and 1244 of the first and second rail stacks. In this way, a via or contact hole 1264 is formed which exposes the underlying metal interconnect 1217 and which exposes the landing areas 1249 and 1260 of the first and second rail stacks respectively. If the fill dielectric is an oxide and the top film of the rail stacks are silicon then an etchant comprising $CHF_3+O_2$ can be used to obtain the desired selectivity.

As shown in FIG. 12j, the further offsetting of the edges of the subsequently deposited rail stacks and the use of selective etches has formed a contact via opening having a sidewall 1266 with a stair step configuration. The use of a fill dielectric which can be etched selectively to the rail stacks insures that the formed stair step configuration is preserved during the via contact opening etch. The vertical height of the edges and the lateral offset of the horizontal surfaces of the landing areas defined a slope 1268 of the sidewall 1266. Opening 1264 can also have a substantially vertical sidewall 1270 which is laterally opposite stair step configured sidewall 1260 in order to reduce the area occupied by opening 1264.

Figure 12K:
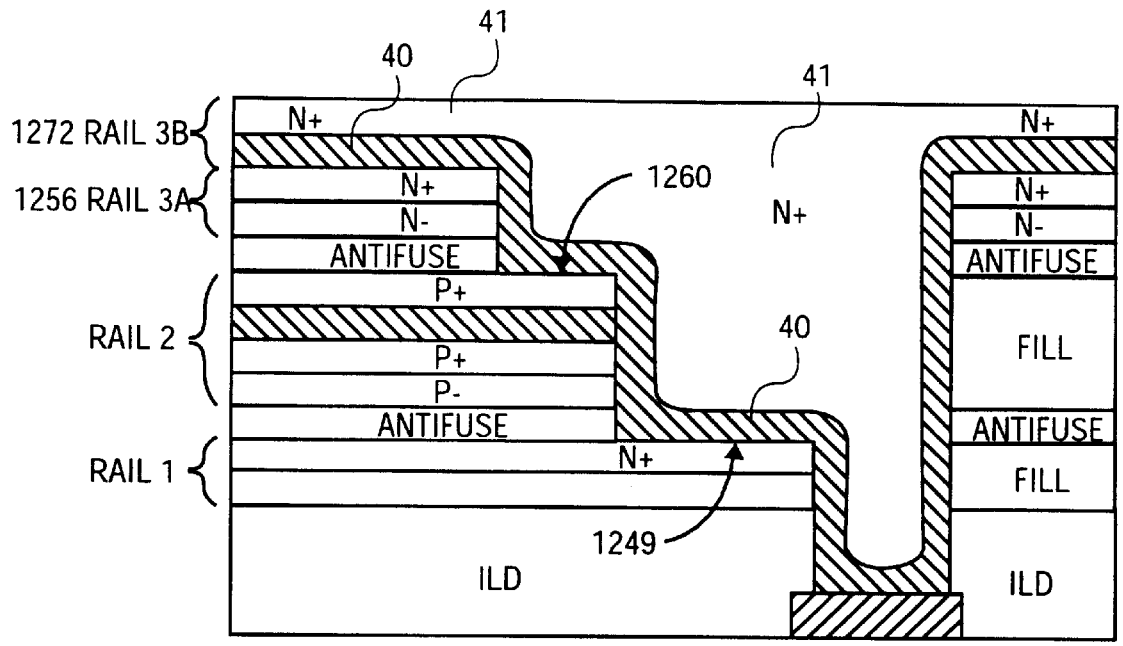
FIG. 12k illustrates the structure of FIG. 12J after the formation of the second portion of the third rail stacks.

Next, as shown in FIG. 12k, the photoresist mask 1262 is removed and the second portion 1272 of the third rail stack can be deposited to complete the formation of the films necessary to form the third rail stack. In an embodiment of the present invention, the second portion 1272 of the third rail stack comprises a conductor 40 such as titanium silicide film, and a top in-situ doped N+ silicon film 41. A titanium silicide ($TiSi_x$) film can be formed by chemical vapor deposition (CVD) or by sputtering. Alternatively, a titanium silicide film can be formed by depositing a titanium silicide film (and a capping TiN film if desired) and then reacting it with the silicon films located below to form $TiSi_x$. It is to be appreciated that with the reaction method, no titanium silicide will form on oxide portions of the sidewalls. In such a case, the titanium silicide forms ohmic contacts to silicon films of landing pads 1249 and 1260 and the doped poly 41 provides vertical connection.

As shown in FIG. 12k, the conductor layer 40 of the second portion of the third rail stack makes electrical contact with the first and second film stacks on landing areas 1260 and 1262 respectively. The formation a titanium silicide conductor 40 enables an ohmic contact to be made to the P+ silicon film 1244 and the N+ silicon film 1228. In this way, the P type silicon films of the second rail stacks can be coupled to the N type silicon film of the first and third rail stacks.

Figure 12L:
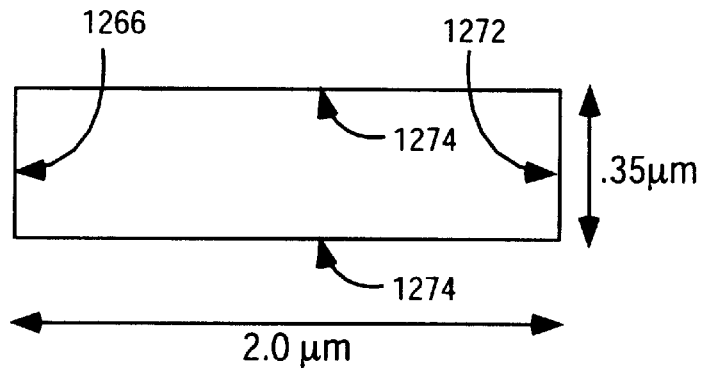
FIG. 12l illustrates an overhead view of the contact opening.

It is to be appreciated that the via opening 1264 can be completely filled by the second portion 1272 of the third rail stack by properly choosing the dimensions of the via opening. For example, FIG. 12l shows an overhead view of opening 1264. Opening 1264 has a length of approximately 2 μm which enables sufficient room to form a stair step sidewall 1266. The opening 1264 has a small width, approximately 0.3 μm which ensures that when the second portion 1272 of the third rail stack films are deposited, they fill from the sidewalls 1274 requiring only about 1800 Å of the second portion of the third rail stack to insure complete filling of the via opening. It is to be appreciated that the dimensions of the contact or via openings will be determined by a number of variables including how many levels of rail stacks are to be electrically coupled, the slope desired of the sidewalls, and the process capabilities.

Once the top portion of the films for the third rail stack have been deposited, the rail stack films can then be masked and etched into a third plurality of rail stacks and processing continued as described above with respect to rail stacks 1 and 2.

It is to be appreciated that although the structure and methods of the present invention have been described with respect to the electrical coupling of the first three rail stacks, the present invention is equally useful for coupling as many rail stacks as desired (e.g., rail stacks 1–6) and can be used to electrically couple internal rail stacks together (e.g., rail stacks 4, 5, and 6) if desired. Still further, the contact structure and method of the present invention can be used to make electrical connection between non sequentially positioned rail stacks without making contact to rail stacks located between the coupled rail stacks (e.g., rail stack 3, 4, and 6). The present invention provides a novel method and structure for electrically coupling a plurality of rail stacks or any other wiring or silicon contact layers together in a reduced number of depositions and etch steps.

Figure 13:
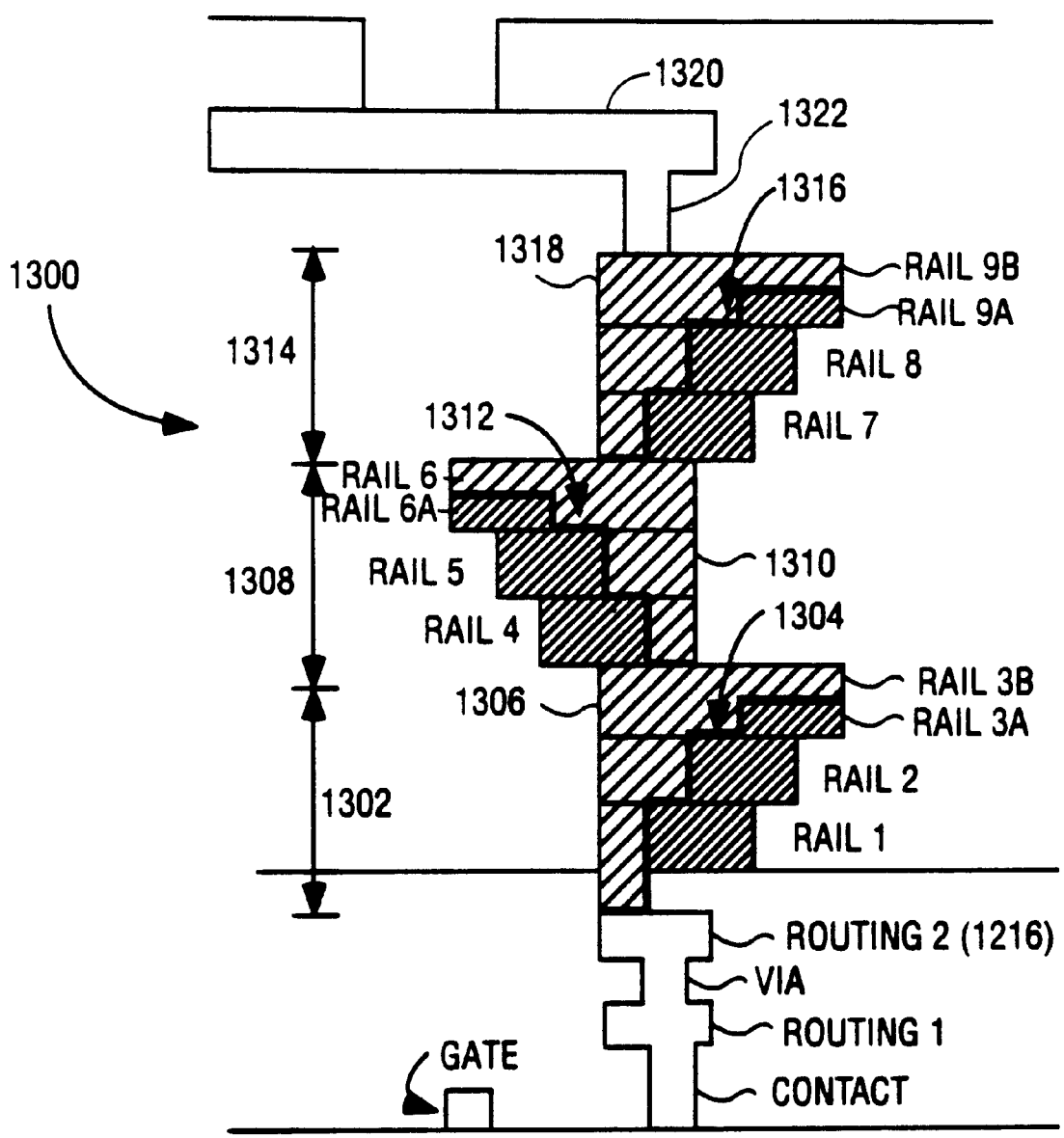
FIG. 13 illustrates a contact structure which can be used to interconnect the large number of rail stacks and/or to provide electrically connections from the upper most levels of metalization to the lower most levels of metalization.

FIG. 13 illustrates an example of a contact structure 1300 which can be used to interconnect a large number of rail stacks and/or to provide an electrical connection from the upper most levels of metalization (e.g., the top metal layer) to the lower most levels of metalization (e.g., routing level R2). Via structure 1300 includes first via portion 1302 formed on and in electrical contact with a lower level of metalization (e.g., routing layer 2). First via portion 1302 has a first sidewall 1304 with a stair step configuration and a second sidewall 1306, opposite the first sidewall 1302 with a substantially vertical sidewall. The stair stepped configured sidewall 1304 is formed by the lateral offset of the vertical edges of the first rail stack, the second rail stack, and the bottom portion of the third rail stack. The top portion of the third rail stack makes electrical connection to the first and second rails as well as to routing layer 2 (1216). The top portion of the third rail stack completely fills the contact opening as shown in FIG. 13.

Via 1300 also includes a second via portion 1308 formed on and in electrical contact with the first via portion 1302. The second via portion 1302 includes a first sidewall 1310 with a substantially vertical sidewall and a second sidewall 1312, opposite the first sidewall 1310, with a stair step configuration. As shown in FIG. 13 the stair step sidewall 1304 of via portion 1302 is on the opposite side as the stair step sidewall 1312 of via portion 1308. The stair step sidewall 1312 is formed by laterally offsetting the vertical edges of the fourth rail stack, the fifth rail stack, and the bottom portion of the sixth rail stack as shown in FIG. 13. The top portion of the sixth rail stack is in electrical contact with the fifth rail stack, the fourth rail stack, and contacts the top portion of the third rail stack used to fill first via portion 1302. Positioning the stair step sidewalls 1312 and 1304 on opposite sides greatly reduces the substrate area required to form a contact from the top of the substrate to the bottom of the substrate.

Via structure 1300 also includes a third via portion 1314 formed in electrical contact with the second portion 1308 of the via structure 1300. The third via portion 1314 has a first sidewall 1316 with a stair step configuration and a second sidewall 1318, opposite the first sidewall, having a substantially vertical sidewall. The stair step structure 1316 is formed by laterally offsetting the vertical edges of the seventh rail stack, the eighth rail stack, and the bottom portion of the ninth rail stack as shown in FIG. 13. The top portion of the ninth rail stack is in direct electrical contact with the eight rail stack, the seventh rail stack, and the top portion of the sixth rail stack used to fill contact portion 1308. The stair step sidewall 1316 of the third via portion 1314 can be formed on the opposite side of the stair step sidewall 1312 of the second via portion 1308.

As can be seen from FIG. 13, by breaking the contact structure 1300 into stacked portions 1302, 1308, and 1314 having stair step sidewalls, a electrical connection can be made from the top levels of metal (e.g., top metal layer 1320) through a plug 1322 to lower levels of metalization with only a small amount of substrate surface area. The via structure 1300 also enables an electrical contact to be made in a reduced number of process steps such as a reduced number of masking, etching, and deposition steps which significantly reduces the cost of the process.

Figure 14:
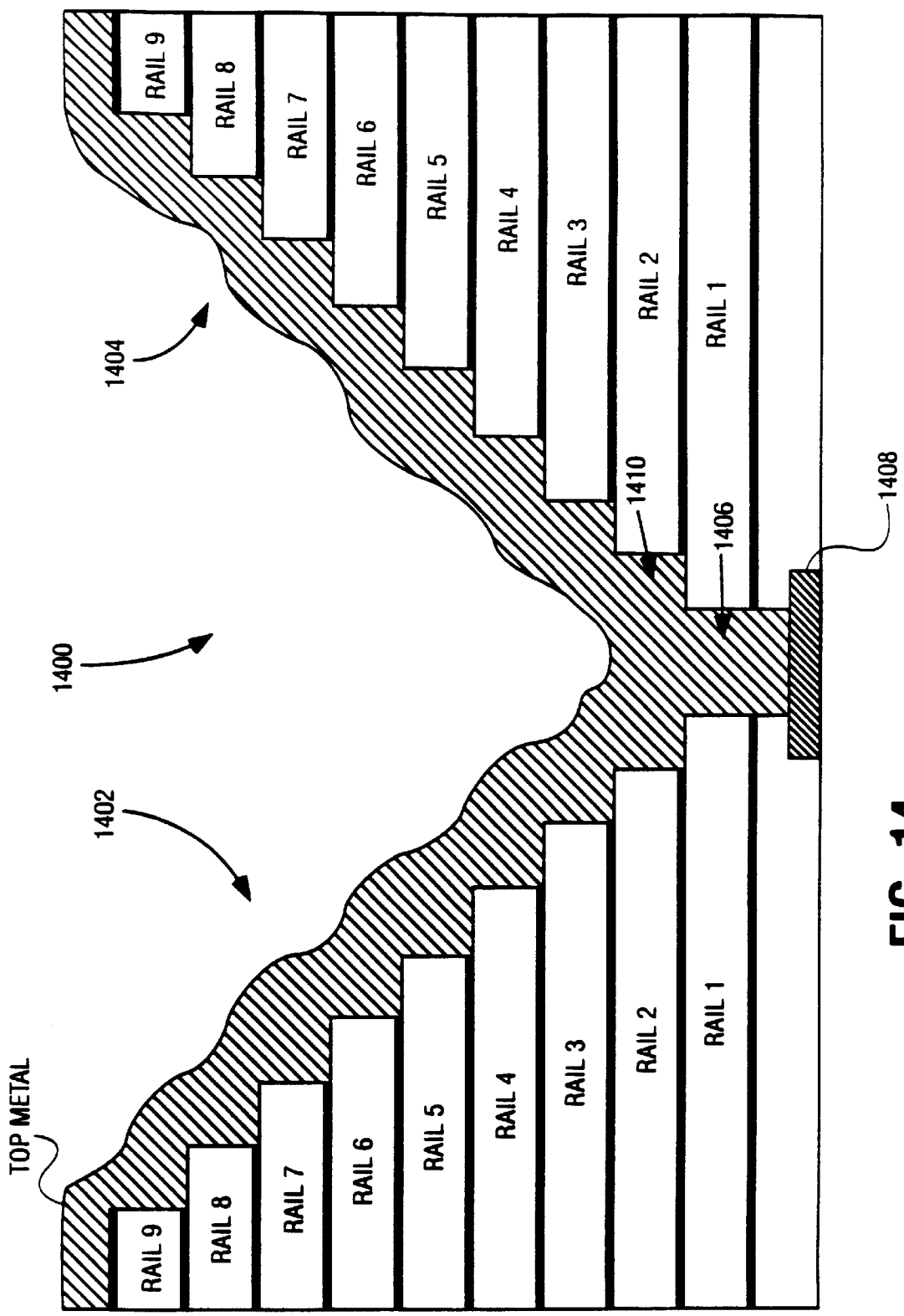
FIG. 14 illustrates a via structure in accordance with another embodiment of the present invention.

FIG. 14 is an illustration of a via structure 1400 in accordance with another embodiment of the present invention. Via structure 1400 includes a first sidewall 1402 having a stair step configuration and a second opposite sidewall 1404 also having a stair step configuration. The via structure can be formed by forming a first gap 1406 in the first rail stack over an interconnection 1408 of, for example, routing layer 2, and then forming a second gap 1410 larger than the first gap in the second rail stack over the first gap 1406, and then forming a third gap in the third rail stack over the second gap in the second rail stack wherein the third gap is larger than the second gap. Successively larger gaps are formed in each successive rail stack until the top of the substrate is reached. (It is to be appreciated that after the formation of each gap and rail the gap is back filled with the fill dielectric. A via opening is then formed by utilizing a fill dielectric etch which is selective to the rail stack films as described above.)

By forming a stair step sidewall from the top to the lower surface a single continuous low resistance film, such as aluminum or aluminum alloys, can make direct electrical contact to the lower metal layers. It is to be appreciated that lower resistance metals, such as aluminum, are usually deposited by sputter deposition. Sputter deposited films require a sidewall slope in order to reliably fill a via opening extending through multiple layers of metalization. In an embodiment of the present invention, the slope of the sidewalls 1402 and 1404 is less than 2:1 (height:width).

The via structure 1400 of FIG. 14 is ideally suited for providing power, such as VCC, directly to the substrate (or lower levels of metalization). When providing power supply to the substrate, electrical connection to the individual rail stacks is incidental and what is important is to provide a sidewall slope. When using contact 1400 to provide power to the substrate, the portions of the rail stack used to create the stair step configuration are electrically isolated from the portions of the rail stacks used to form the memory devices.

Figure 15:
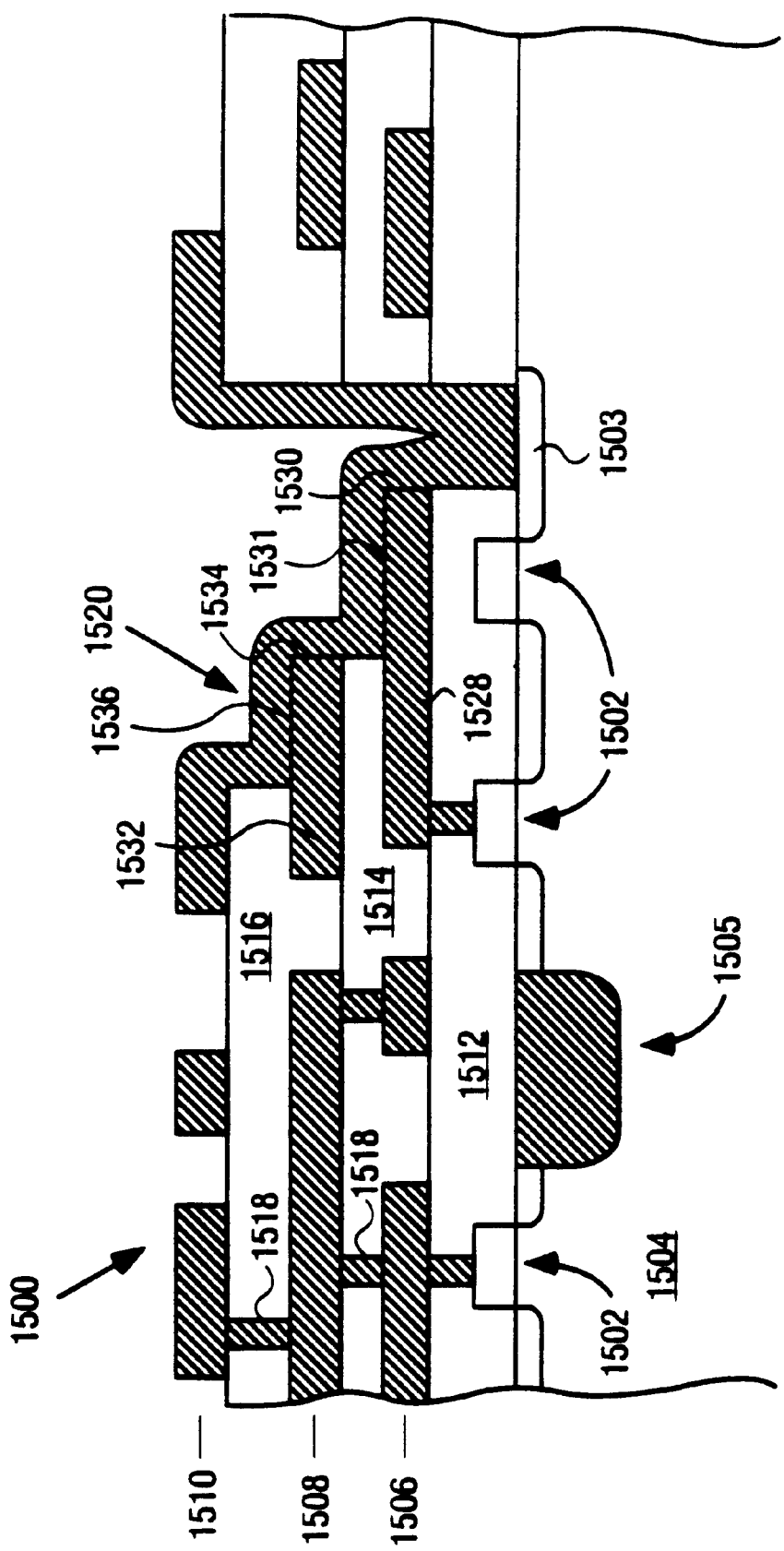
FIG. 15 illustrates a contact having a stair stepped structure formed in a logic device.

It is to be appreciated that the present invention is not limited to the use and formation of memories and can be used in the formation of logic circuits, such as microprocessors and digital signal processing circuits. For example, FIG. 15 illustrates a portion of a logic circuit 1500 having a plurality devices 1502, such as transistors formed in a silicon substrate 1504 and isolated by isolation regions 1505. Logic circuit 1500 includes a first level of metalization or interconnects 1506, a second level of metalization or interconnects 1508, and a third level of metalization or interconnects 1510. The interconnects can be formed of, for example, aluminum, copper, and tungsten. The interconnects are electrically isolated from one another by interlevel dielectrics 1512, 1514, and 1516 respectively, such as silicon dioxide interlayer dielectrics. Vias or contacts 1518, such as tungsten plugs, provide electrical connection vertically between metalization layers through the interlayer dielectrics.

As shown in FIG. 15, a contact 1520 can be made in which the third metal layer 1510 makes electrical contact to the second level of metalization 1508, the first level of metalization 1506 and a doped substrate region 1503, such as a source or drain. Such a contact structure 1520 can be fabricated as described above by forming an interconnect 1528 in the first level of metalization with an edge 1530 over the contact area, and forming an interconnect 1532 in the second level having an edge 1534 over the interconnect 1528 and offset from the edge 1530 to form a landing pad 1531. A via opening is then etched through the interlayer dielectric 1516 above interconnect 1532 and offset from edge 1534 to form a landing pad 1536 on interconnect 1532. The via opening is also etched through the interlayer dielectric 1514 over the interconnect 1528 to expose landing area 1531. An etchant which can etch the interlayer dielectrics without significantly etching the metal interconnects is used so that the stair step structure formed in the first and second levels of metalization would be preserved. (That is a via hole is be etched with an etch which can remove the interlayer dielectrics 1512, 1514, and 1516, but which is selective to the metal layers). The third level of metalization can then be deposited and formed in the via opening on the landing pads 1531 and 1536 created on interconnects 1528 and 1532 as shown.

Thus, methods and structures for providing electrical contact between multiple levels of an integrated circuit with a reduced number of process steps have been described.

What is claimed is:

1. A contact in a three dimensional memory device comprising:
    a conductive film;
    an opening formed through a plurality of film stacks of a three dimensional memory device, said opening having a top and bottom wherein said bottom is formed on said conductive film, said opening having a first sidewall and second sidewall, wherein said first sidewall is opposite of said second sidewall, and wherein said first sidewall has a stair step configuration, wherein said first sidewall is closer to said second sidewall at said bottom of said opening than at the top of said opening; and a conductor formed on said stair step configuration said first sidewall of said opening and on said bottom of said opening on said conductive film.

2. The contact of claim 1 wherein said second sidewall has a second stair step configuration.

3. The contact of claim 1 wherein said continuous conductor is aluminum or aluminum alloy.

4. The contact of claim 1 wherein said first sidewall has a slope (height:width) of less than 2:1.

5. A contact in a three dimensional memory device comprising:
   a contact opening formed through a plurality of film stacks of a three-dimensional memory, said contact having a bottom on an interconnection, said contact opening having a first and second laterally opposite sidewalls, wherein said first sidewall comprises:
      a first vertical side extending up from said bottom;
      a first horizontal surface extending from said first vertical side to a second vertical side, said second vertical side further spaced from said second sidewall than said first vertical side;
      a second horizontal surface extending from said second vertical side to a third vertical side wherein said third vertical side is spaced further from said second sidewall than said second vertical side; and
   a conductor formed on said first sidewall and on said interconnection in the bottom of said contact opening.

6. The contact of claim 5 wherein said conductor is an aluminum or an aluminum alloy.

7. A contact of a three dimensional memory device comprising:
   a first and a second film stack of a three dimensional memory device said first film stack said having a first part and a second part separated by a first gap, said first film stack having a top conductive film;
   said second film stack formed on said first film stack, said second film stack having a first part and a second part separated by a second gap wherein said second gap formed over said first gap so as to expose said top conductive film of said first film stack, said second film stack having a top conductive film; and
   a conductive contact film formed on said top conductive film on said second film stack and on said top conductive film of said first film stack in said second gap.

8. The contact of claim 7 further comprising a third film stack having a top conductive film, said third film stack formed over said second film stack, said third film stack having a first part and a second part separated by a third gap over said second gap wherein said third gap is larger than said second gap so as to expose said top conductive film of said second film stack and wherein said continuous conductive film is formed on said top conductive film of said second film stack in said third gap.

9. A contact comprising:
   a first film stack having a first part and a second part separated by a first gap, said first film stack having a top conductive film wherein said first film stack comprises a top P+ film formed on a silicide film which is formed on a P+ silicon film which is formed on a P– silicon film which is formed on a antifuse layer;
   a second film stack formed on said first film stack, said second film stack having a first part and a second part separated by a second gap formed over said first gap so as to expose said top conductive film of said first film stack, said second film stack having a top conductive film; and
   a continuous conductive contact film formed on said top conductive film on said second film stack and on said top conductive film of said first film stack in said second gap.

10. The contact of claim 9 wherein said second film stack comprises a top N+ silicon film formed on a silicide film which is formed on a N+ silicon film which is formed on a N– silicon film which is formed on a antifuse film.

11. A contact comprising:
    a first film stack having a first part and a second part separated by a first gap, said first film stack having a top conductive film;
    a second film stack formed on said first film stack, said second film stack having a first part and a second part separated by a second gap formed over said first gap so as to expose said top conductive film of said first film stack, said second film stack having a top conductive film; and
    a continuous conductive contact film formed on said top conductive film on said second film stack and on said top conductive film of said first film stack in said second gap wherein said first film stack comprises a top N+ silicon film formed on a silicide film which is formed on a N+ silicon film which is formed on a N– silicon film which is formed on a antifuse film.

12. The contact of claim 11 wherein said second film stack comprises a top P+ silicon film formed on a silicide film which is formed on a P+ silicon film which is formed on a P– film which is formed on a antifuse layer.

13. A contact comprising:
    a first film stack having a first part and a second part separated by a first gap, said first film stack having a top conductive film;
    a second film stack formed on said first film stack, said second film stack having a first part and a second part separated by a second gap formed over said first gap so as to expose said top conductive film of said first film stack, said second film stack having a top conductive film; and
    a continuous conductive contact film formed on said top conductive film on said second film stack and on said top conductive film of said first film stack in said second gap wherein said continuous conductive contact film comprises a top P+ silicon film formed on a silicide film.

14. A contact comprising:
    a first film stack having a first part and a second part separated by a first gap, said first film stack having a top conductive film;
    a second film stack formed on said first film stack, said second film stack having a first part and a second part separated by a second gap formed over said first gap so as to expose said top conductive film of said first film stack, said second film stack having a top conductive film; and
    a continuous conductive contact film formed on said top conductive film on said second film stack and on said top conductive film of said first film stack in said second gap wherein said continuous conductive contact film comprises a top N+ silicon film formed on a silicide film.

15. The contact of claim 7 wherein said continuous conductive film is aluminum or an aluminum alloy.

16. The contact of claim 13 wherein said silicide film comprises titanium silicide.

17. The contact of claim 14 wherein said silicide film comprises titanium silicide.

18. A contact comprising:

a contact opening having a bottom on an interconnection, said contact opening having a first and second laterally opposite sidewalls, wherein said first sidewall comprises:
  a first vertical side extending up from said bottom;
  a first horizontal surface extending from said first vertical side to a second vertical side, said second vertical side further spaced from said second sidewall than said first vertical plane;
a second horizontal surface extending from said second vertical side to a third vertical side wherein said third vertical side is spaced further from said second sidewall than said second vertical side; and
a continuous conductor formed on said first sidewall and on said interconnection in the bottom of said contact opening wherein said continuous conductor comprises a top p+ silicon film formed on a silicide film.

19. The contact of claim 18 wherein said silicide film comprises titanium silicide.

20. A contact comprising:

a contact opening having a bottom on an interconnection, said contact opening having a first and second laterally opposite sidewalls, wherein said first sidewall comprises:
  a first vertical side extending up from said bottom;
  a first horizontal surface extending from said first vertical side to a second vertical side, said second vertical side further spaced from said second sidewall than said first vertical side;
  a second horizontal surface extending from said second vertical side to a third vertical side wherein said third vertical side is spaced further from said second sidewall than said second vertical side; and
a continuous conductor formed on said first sidewall and on said interconnection in the bottom of said contact opening wherein said continuous conductor comprises a top n+ silicon film formed on a silicide film.

21. The contact of claim 20 wherein the silicide film comprises titanium silicide.

* * * * *